United States Patent
Butterworth

(10) Patent No.: US 10,951,237 B2
(45) Date of Patent: Mar. 16, 2021

(54) COMPOSING ARRAY CODES FOR POWER OF TWO AND VARIABLE BLOCK SIZES

(71) Applicant: International Business Machines Corporation, Armonk, NY (US)

(72) Inventor: Henry E. Butterworth, Shanghai (CN)

(73) Assignee: International Business Machines Corporation, Armonk, NY (US)

(*) Notice: Subject to any disclaimer, the term of this patent is extended or adjusted under 35 U.S.C. 154(b) by 21 days.

(21) Appl. No.: 16/362,468

(22) Filed: Mar. 22, 2019

(65) Prior Publication Data

US 2020/0304154 A1 Sep. 24, 2020

(51) Int. Cl.
*H03M 13/29* (2006.01)
*G06F 11/10* (2006.01)

(52) U.S. Cl.
CPC ..... *H03M 13/2906* (2013.01); *G06F 11/1076* (2013.01)

(58) Field of Classification Search
CPC ............ H03M 13/2906; G06F 11/1076
See application file for complete search history.

(56) References Cited

U.S. PATENT DOCUMENTS

| | | | | |
|---|---|---|---|---|
| 5,457,702 A * | 10/1995 | Williams, III | ...... | G06F 11/1028 714/755 |
| 8,335,966 B1 * | 12/2012 | Lary | ........... | G06F 11/1076 714/6.24 |
| 9,280,382 B1 * | 3/2016 | Stefansson | .......... | G06F 15/8023 |
| 9,465,692 B2 | 10/2016 | Doerner | | |
| 10,014,881 B2 | 7/2018 | Blaum et al. | | |
| 2002/0053050 A1 * | 5/2002 | Senshu | .............. | G11B 20/1866 714/701 |
| 2011/0248873 A1 * | 10/2011 | Karczewicz | ......... | H04N 19/184 341/67 |
| 2015/0067441 A1 * | 3/2015 | Gorissen | ................. | G06F 7/544 714/759 |
| 2015/0309869 A1 * | 10/2015 | Mittelholzer | ..... | H03M 13/2903 714/764 |
| 2016/0072525 A1 | 3/2016 | Anderson | | |
| 2016/0364290 A1 * | 12/2016 | Geng | .................. | G06F 11/1068 |
| 2017/0262338 A1 * | 9/2017 | Nakata | .................. | G06F 3/0677 |
| 2018/0052737 A1 | 2/2018 | Han | | |
| 2019/0018664 A1 * | 1/2019 | Mani | ..................... | G06F 8/4442 |
| 2020/0007893 A1 * | 1/2020 | Leleannec | ............ | H04N 19/157 |
| 2020/0304153 A1 * | 9/2020 | Kimura | ............. | H03M 13/2792 |

OTHER PUBLICATIONS

Cooley et al., "Software-based Erasure Codes for Scalable Distributed Storage," 20th IEEE Symposium on Mass Storage Systems, 2003, 8 pages.

(Continued)

*Primary Examiner* — Guy J Lamarre
(74) *Attorney, Agent, or Firm* — Zilka-Kotab, P.C.

(57) ABSTRACT

A computer-implemented method according to one embodiment includes identifying a block size used by an application, where the block size is a power of two, constructing, utilizing a plurality of instances of a first array code, a single instance of a second array code having a symbol size that matches the block size used by the application, where the symbol size of the second array code is always a power of two, and implementing the second array code within the application.

20 Claims, 7 Drawing Sheets

(56) References Cited

OTHER PUBLICATIONS

Blaum et al., "MDS Array Codes with Independent Parity Symbols," IEEE Transactions on Information Theory, vol. 12, No. 2, Mar. 1996, pp. 529-542.

Wikipedia, "Bézout's identity," Wikipedia, Jun. 2018, pp. 1-4, retrieved from https://en.wikipedia.org/w/index.php?title=B%C3%A9zout%27s_identity&oldid=846232194.

Wikipedia, "Curiously recurring template pattern," Wikipedia, Apr. 2018, pp. 1-6, retrieved from https://en.wikipedia.org/w/index.php?title=Curiously_recurring_template_pattern&oldid=836319244.

Wikipedia, "Extended Euclidean algorithm," Wikipedia, May 2018, pp. 1-7, retrieved from https://en.wikipedia.org/w/index.php?title=Extended_Euclidean_algorithm&oldid=842574763.

Wikipedia, "Fermat number," Wikipedia, Aug. 2018, pp. 1-13, retrieved from https://en.wikipedia.org/w/index.php?title=Fermat_number&oldid=856607648.

Williams, R., "FunnelWeb," Ross.Net, May 1999, 1 page, retrieved from http://www.ross.net/funnelweb/.

Blaum et al., "The EVENODD Code and its Generalization: An Efficient Scheme for Tolerating Multiple Disk Failures in Raid Architectures," High Performance Mass Storage and Parallel I/O, 2001, pp. 1-36.

\* cited by examiner

COMPOSING ARRAY CODES FOR POWER OF TWO AND VARIABLE BLOCK SIZES

BACKGROUND

The present invention relates to data recovery, and more specifically, this invention relates to implementing array codes for target applications.

Array codes are commonly used to provide data recovery services during data transmission and/or storage. However, current array code implementations have various constraints. For example, the shape of current array codes is not convenient for use, as current array codes are based on prime numbers, and commonly used data storage and transmission formats utilize sizes conforming to powers of two. This results in wide array codes that do not allow many erasure recoveries, as well as codes with very large symbol sizes.

SUMMARY

A computer-implemented method according to one embodiment includes identifying a block size used by an application, where the block size is a power of two, constructing, utilizing a plurality of instances of a first array code, a single instance of a second array code having a symbol size that matches the block size used by the application, where the symbol size of the second array code is always a power of two, and implementing the second array code within the application.

According to another embodiment, a computer program product for composing array codes for power of two and variable block sizes includes a computer readable storage medium having program instructions embodied therewith, where the computer readable storage medium is not a transitory signal per se, and where the program instructions are executable by a processor to cause the processor to perform a method including identifying, utilizing the processor, a block size used by an application, where the block size is a power of two, constructing, utilizing the processor and a plurality of instances of a first array code, a single instance of a second array code having a symbol size that matches the block size used by the application, where the symbol size of the second array code is always a power of two, and implementing, utilizing the processor, the second array code within the application.

According to another embodiment, a system includes a processor, and logic integrated with the processor, executable by the processor, or integrated with and executable by the processor, where the logic is configured to identify a block size used by an application, where the block size is a power of two, construct, utilizing a plurality of instances of a first array code, a single instance of a second array code having a symbol size that matches the block size used by the application, where the symbol size of the second array code is always a power of two, and implement the second array code within the application.

Other aspects and embodiments of the present invention will become apparent from the following detailed description, which, when taken in conjunction with the drawings, illustrate by way of example the principles of the invention.

DETAILED DESCRIPTION

Figure 1:
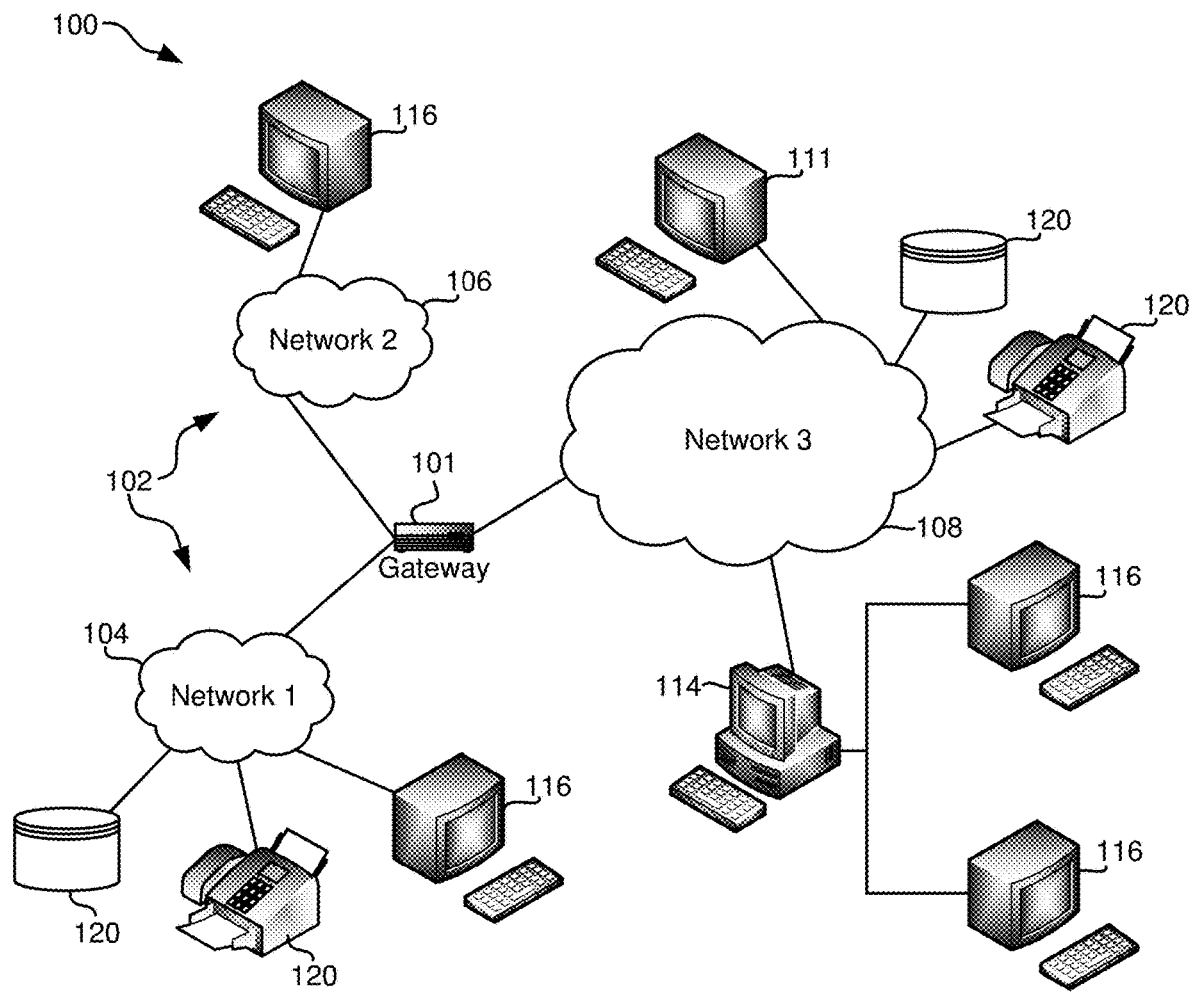
FIG. 1 illustrates a network architecture, in accordance with one embodiment.

The following description discloses several preferred embodiments of systems, methods and computer program products for composing array codes for power of two and variable block sizes. Various embodiments provide a method to create a single instance of a second array code having a symbol size that matches a block size used by an application utilizing a plurality of instances of a different array code, where the symbol size of the created array code is always a power of two.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified. It will be further understood that the terms "includes" and/or "comprising," when used in this specification, specify the presence of stated features, integers, steps, operations, elements, and/or components, but do not preclude the presence or addition of one or more other features, integers, steps, operations, elements, components, and/or groups thereof.

The following description discloses several preferred embodiments of systems, methods and computer program products for composing array codes for power of two and variable block sizes.

In one general embodiment, a computer-implemented method includes identifying a block size used by an application, where the block size is a power of two, constructing, utilizing a plurality of instances of a first array code, a single instance of a second array code having a symbol size that matches the block size used by the application, where the symbol size of the second array code is always a power of two, and implementing the second array code within the application.

In another general embodiment, a computer program product for composing array codes for power of two and variable block sizes includes a computer readable storage medium having program instructions embodied therewith, where the computer readable storage medium is not a transitory signal per se, and where the program instructions are executable by a processor to cause the processor to perform a method including identifying, utilizing the processor, a block size used by an application, where the block size is a power of two, constructing, utilizing the processor and a plurality of instances of a first array code, a single instance of a second array code having a symbol size that matches the block size used by the application, where the symbol size of the second array code is always a power of two, and implementing, utilizing the processor, the second array code within the application.

In another general embodiment, a system includes a processor, and logic integrated with the processor, executable by the processor, or integrated with and executable by the processor, where the logic is configured to identify a block size used by an application, where the block size is a power of two, construct, utilizing a plurality of instances of a first array code, a single instance of a second array code having a symbol size that matches the block size used by the application, where the symbol size of the second array code is always a power of two, and implement the second array code within the application.

FIG. 1 illustrates an architecture 100, in accordance with one embodiment. As shown in FIG. 1, a plurality of remote networks 102 are provided including a first remote network 104 and a second remote network 106. A gateway 101 may be coupled between the remote networks 102 and a proximate network 108. In the context of the present architecture 100, the networks 104, 106 may each take any form including, but not limited to a LAN, a WAN such as the Internet, public switched telephone network (PSTN), internal telephone network, etc.

In use, the gateway 101 serves as an entrance point from the remote networks 102 to the proximate network 108. As such, the gateway 101 may function as a router, which is capable of directing a given packet of data that arrives at the gateway 101, and a switch, which furnishes the actual path in and out of the gateway 101 for a given packet.

Further included is at least one data server 114 coupled to the proximate network 108, and which is accessible from the remote networks 102 via the gateway 101. It should be noted that the data server(s) 114 may include any type of computing device/groupware. Coupled to each data server 114 is a plurality of user devices 116. User devices 116 may also be connected directly through one of the networks 104, 106, 108. Such user devices 116 may include a desktop computer, lap-top computer, hand-held computer, printer or any other type of logic. It should be noted that a user device 111 may also be directly coupled to any of the networks, in one embodiment.

A peripheral 120 or series of peripherals 120, e.g., facsimile machines, printers, networked and/or local storage units or systems, etc., may be coupled to one or more of the networks 104, 106, 108. It should be noted that databases and/or additional components may be utilized with, or integrated into, any type of network element coupled to the networks 104, 106, 108. In the context of the present description, a network element may refer to any component of a network.

According to some approaches, methods and systems described herein may be implemented with and/or on virtual systems and/or systems which emulate one or more other systems, such as a UNIX system which emulates an IBM z/OS environment, a UNIX system which virtually hosts a MICROSOFT WINDOWS environment, a MICROSOFT WINDOWS system which emulates an IBM z/OS environment, etc. This virtualization and/or emulation may be enhanced through the use of VMWARE software, in some embodiments.

In more approaches, one or more networks 104, 106, 108, may represent a cluster of systems commonly referred to as a "cloud." In cloud computing, shared resources, such as processing power, peripherals, software, data, servers, etc., are provided to any system in the cloud in an on-demand relationship, thereby allowing access and distribution of services across many computing systems. Cloud computing typically involves an Internet connection between the systems operating in the cloud, but other techniques of connecting the systems may also be used.

Figure 2:
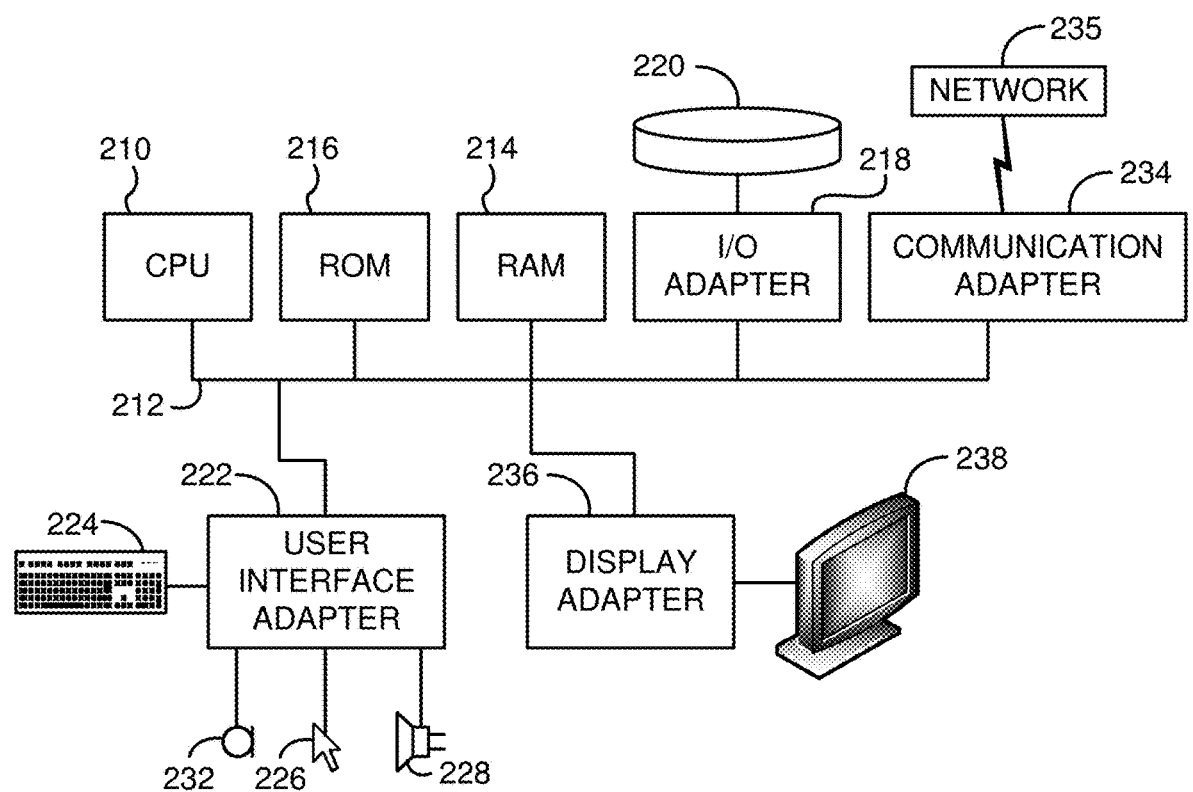
FIG. 2 shows a representative hardware environment that may be associated with the servers and/or clients of FIG. 1, in accordance with one embodiment.

FIG. 2 shows a representative hardware environment associated with a user device 116 and/or server 114 of FIG. 1, in accordance with one embodiment. Such figure illustrates a typical hardware configuration of a workstation having a central processing unit 210, such as a microprocessor, and a number of other units interconnected via a system bus 212.

The workstation shown in FIG. 2 includes a Random Access Memory (RAM) 214, Read Only Memory (ROM) 216, an I/O adapter 218 for connecting peripheral devices such as disk storage units 220 to the bus 212, a user interface adapter 222 for connecting a keyboard 224, a mouse 226, a speaker 228, a microphone 232, and/or other user interface devices such as a touch screen and a digital camera (not shown) to the bus 212, communication adapter 234 for connecting the workstation to a communication network 235 (e.g., a data processing network) and a display adapter 236 for connecting the bus 212 to a display device 238.

The workstation may have resident thereon an operating system such as the Microsoft Windows® Operating System (OS), a MAC OS, a UNIX OS, etc. It will be appreciated that a preferred embodiment may also be implemented on platforms and operating systems other than those mentioned. A preferred embodiment may be written using XML, C, and/or C++ language, or other programming languages, along with an object oriented programming methodology. Object oriented programming (OOP), which has become increasingly used to develop complex applications, may be used.

Figure 3:
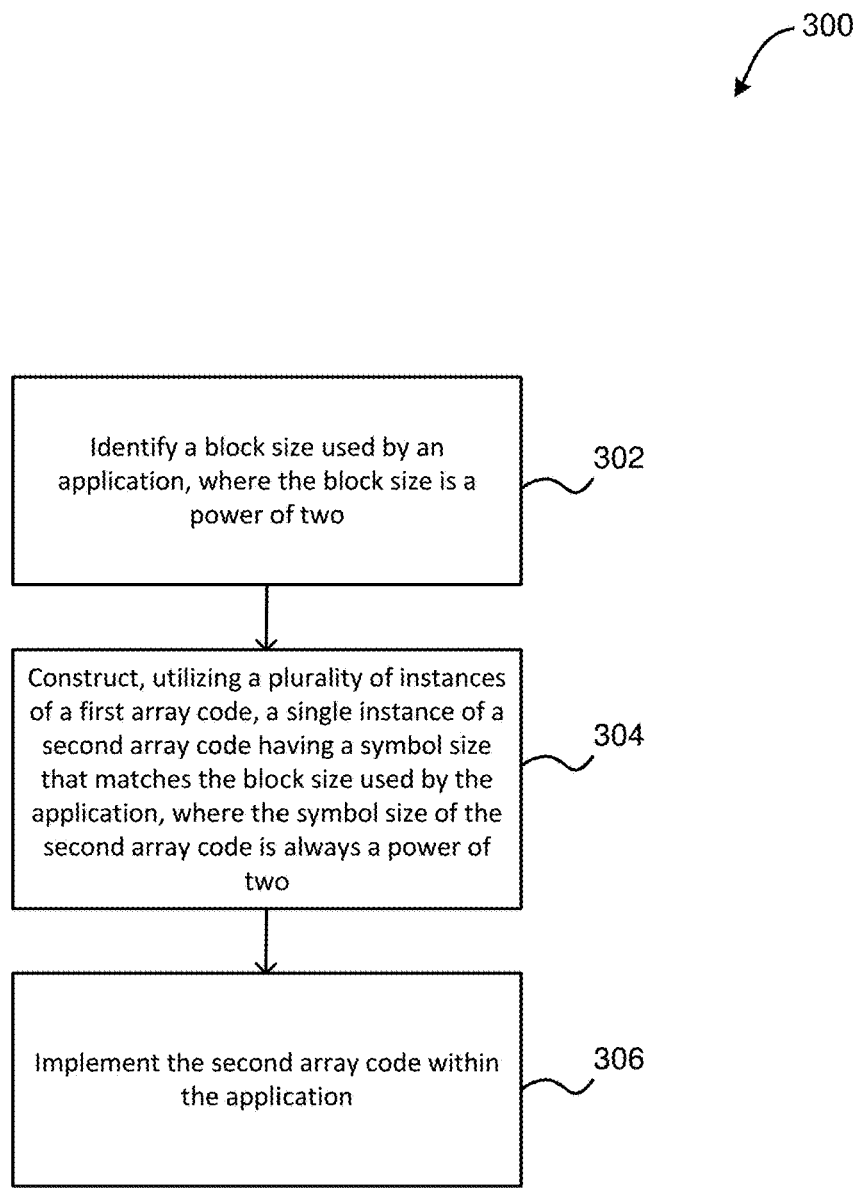
FIG. 3 illustrates a method for composing array codes for power of two and variable block sizes, in accordance with one embodiment.

Now referring to FIG. 3, a flowchart of a method 300 is shown according to one embodiment. The method 300 may be performed in accordance with the present invention in any of the environments depicted in FIGS. 1-2, among others, in various embodiments. Of course, more or less operations than those specifically described in FIG. 3 may be included in method 300, as would be understood by one of skill in the art upon reading the present descriptions.

Each of the steps of the method 300 may be performed by any suitable component of the operating environment. For example, in various embodiments, the method 300 may be partially or entirely performed by one or more servers, computers, or some other device having one or more processors therein. The processor, e.g., processing circuit(s), chip(s), and/or module(s) implemented in hardware and/or software, and preferably having at least one hardware component may be utilized in any device to perform one or more steps of the method 300. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 3, method 300 may initiate with operation 302, where a block size used by an application is identified, where the block size is a power of two. In one embodiment, the application may include a data transfer application. In another embodiment, the application may include a data storage and/or data retrieval application. In yet another embodiment, the application may be run within a single computing system, within a plurality of systems of a multi-system clustered environment, within a cloud computing environment, etc.

Additionally, in one embodiment, additional requirements for the application may be determined. For example, the additional requirements may include a code width to be utilized by the application. In another example, the code width may include a number of symbols within an array code to be implemented within the application. In yet another example, the code width may include the sum of the number of data symbols and the number of parity symbols to by implemented within the array code.

Further, in one embodiment, the additional requirements may include a parity size to be utilized by the application. In another embodiment, the block size may include a necessary and/or useful size of data segments to be utilized by the application. For example, the block size may include a size of data packets being transferred by the application, a size of data packets being stored by the application, etc.

Further still, method 300 may proceed with operation 304, where a single instance of a second array code having a symbol size that matches the block size used by the application is constructed utilizing a plurality of instances of a first array code, where the symbol size of the second array code is always a power of two. In one embodiment, the first array code and the second array code may each include a means by which data is encoded to control and/or recover from data erasure or errors. For example, the first array code and the second array code may each include an erasure code, an error correcting code (ECC), etc.

Also, in one embodiment, the second array code may be different from the first array code. In another embodiment, the symbol size may include a minimum predetermined size of a portion of data for which an array code may be utilized. For example, the symbol size may indicate a required data size to be implemented for the array code.

In addition, in one embodiment, the first array code may have a symbol size that is not always a power of two. For example, the first array code may have a symbol size that is always a function of a prime number. In another example, the first array code may include a generalized EVENODD code. In yet another example, the vertical dimension of the second array code may always be a power of two.

Furthermore, in one embodiment, it may be determined whether the block size used by the application can be provided by the first array code. For example, in response to determining that the block size used by the application can be provided by the first array code, then one or more instances of the first array code may be implemented with the application, and the single instance of the second array code may not be constructed. In another example, in response to determining that the block size used by the application cannot be provided by the first array code, then the first array code may not be implemented with the application, and the single instance of the second array code may be constructed.

Further still, in one embodiment, second array code may be constructed by joining together a stacked configuration of the plurality of instances of the first array code in order to create the second array code with a symbol size that is a power of two. For example, one or more of the plurality of instances of the first array code may have a symbol size different from the other instances of the first array code. In another embodiment, the second array code may include a BlockCode. In yet another embodiment, the second array code may be constructed to meet the additional requirements for the application.

In this way, the second array code may extend the capabilities of the first array code by providing more erasure capability (e.g., via increased parity) and/or greater code width for a given symbol size. This may allow for the implementation of an array code for an application using a smaller symbol size, which may improve a cache performance of the system implementing the application and array code, which may improve an efficiency and/or performance of the system as a result (e.g., since array codes with smaller symbol sizes may have improved cache performance when compared to array codes with larger symbol sizes, etc.).

Also, method 300 may proceed with operation 306, where the second array code is implemented within the application. In one embodiment, implementing the second array code may include using the second array code within the application to control and/or recover from data erasure or error during the implementation of the application. For example, the second array code may act as an erasure code and/or an error correcting code within the application.

Additionally, in one embodiment, the application may be run within one or more systems utilizing the second array code. In another embodiment, a plurality of instances of the second array code may be used to construct a third array code, where the second array code is different from the third array code, and where the second array code has a symbol size that is a power of two, and the third array code may have any desired block size subject to a granularity constraint. In yet another embodiment, the third array code may include a PowerCode.

For example, the first array code may be constrained by mathematical requirements (primes) so, although a few of the possible symbols are power of two sized, in general they are not and the few power of two symbols that are available don't correspond with optimal erasure code properties (e.g., code width, number of parities, etc.). The second array code assembles symbols from the first array code to create symbols which are convenient powers of two with better erasure code properties.

The third array code assembles power-of-two sized symbols of the second array code into symbols which can be any desired length subject to the following granularity constraint: if the smallest symbol is X bytes then the symbol length modulo X must be equal to zero (e.g., X must divide the symbol length exactly with no remainder). Thus, symbols of the third array code may be any multiple of the minimum second array code symbol size and need not be power of two sized.

Further, in one embodiment, the third array code may be constructed by combining the plurality of instances of the second array code. For example, one or more of the plurality of instances of the second array code may have the same symbol size (that is a power of two). In another example, one or more of the plurality of instances of the second array code may have different symbol sizes from the other instances of the second array code (where each of the different symbol sizes is also a power of two).

Further still, in one embodiment, the third array code may have a symbol size that matches the block size used by the application. In another embodiment, the application may be run within one or more systems utilizing the third array code.

In this way, different instances of the second array code having different symbol sizes may be combined to create a third array code that may have one of a wide variety of possible symbol sizes, where each possible symbol size need not be a power of two. This may enable the construction of an erasure code that exactly matches the block size used by the application, which may result in more efficient storage and bandwidth usage by a system implementing the application and array code, which may improve an efficiency and/or performance of the system as a result.

Figure 4:
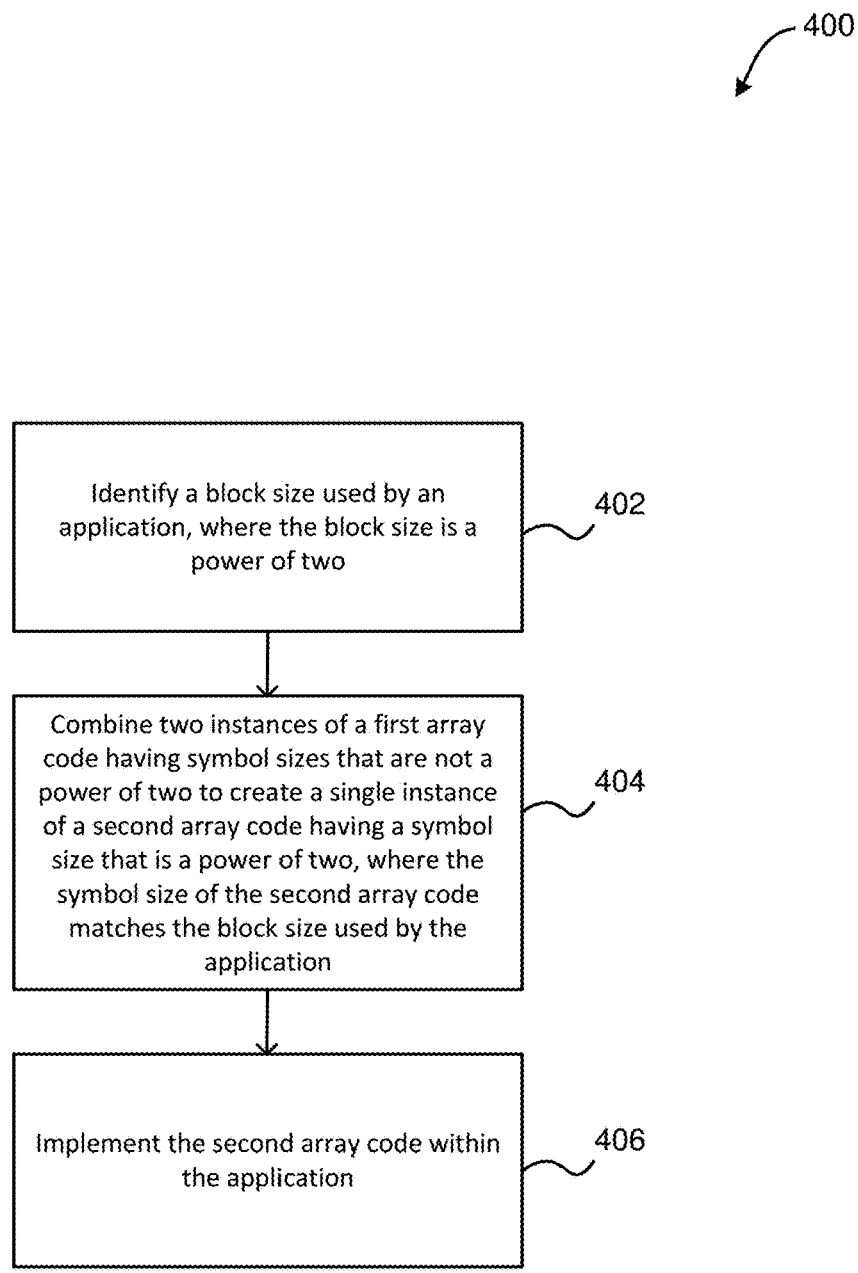
FIG. 4 illustrates a method for creating a single instance of an array code having a symbol size that is a power of two, in accordance with one embodiment.

Now referring to FIG. 4, a flowchart of a method 400 for creating a single instance of an array code having a symbol size that is a power of two is shown according to one embodiment. The method 400 may be performed in accordance with the present invention in any of the environments depicted in FIGS. 1-2, among others, in various embodiments. Of course, more or less operations than those specifically described in FIG. 4 may be included in method 400, as would be understood by one of skill in the art upon reading the present descriptions.

Each of the steps of the method 400 may be performed by any suitable component of the operating environment. For example, in various embodiments, the method 400 may be partially or entirely performed by one or more servers, computers, or some other device having one or more processors therein. The processor, e.g., processing circuit(s), chip(s), and/or module(s) implemented in hardware and/or software, and preferably having at least one hardware component may be utilized in any device to perform one or more steps of the method 400. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 4, method 400 may initiate with operation 402, where a block size used by an application is identified, where the block size is a power of two. Additionally, method 400 may proceed with operation 404, where two instances of a first array code having symbol sizes that are not a power of two are combined to create a single instance of a second array code having a symbol size that is a power of two, where the symbol size of the second array code matches the block size used by the application.

Further, in one embodiment, the first instance of the first array code may have a symbol size of (29−1)=28 elements. In another embodiment, the second instance of the first array code may have a symbol size of (37−1)=36 elements. In yet another embodiment, the single instance of the second array code may have a symbol size of (66−2)=64 elements.

Further still, method 400 may proceed with operation 406, where the second array code is implemented within the application.

In this way, the second array code may be assembled such that its vertical dimension is a power of two. This may minimize a symbol size, while allowing for a wide vector type. Utilizing this construction, the second array code may be created with a power of two array size, which is not possible using just the first array code.

Figure 5:
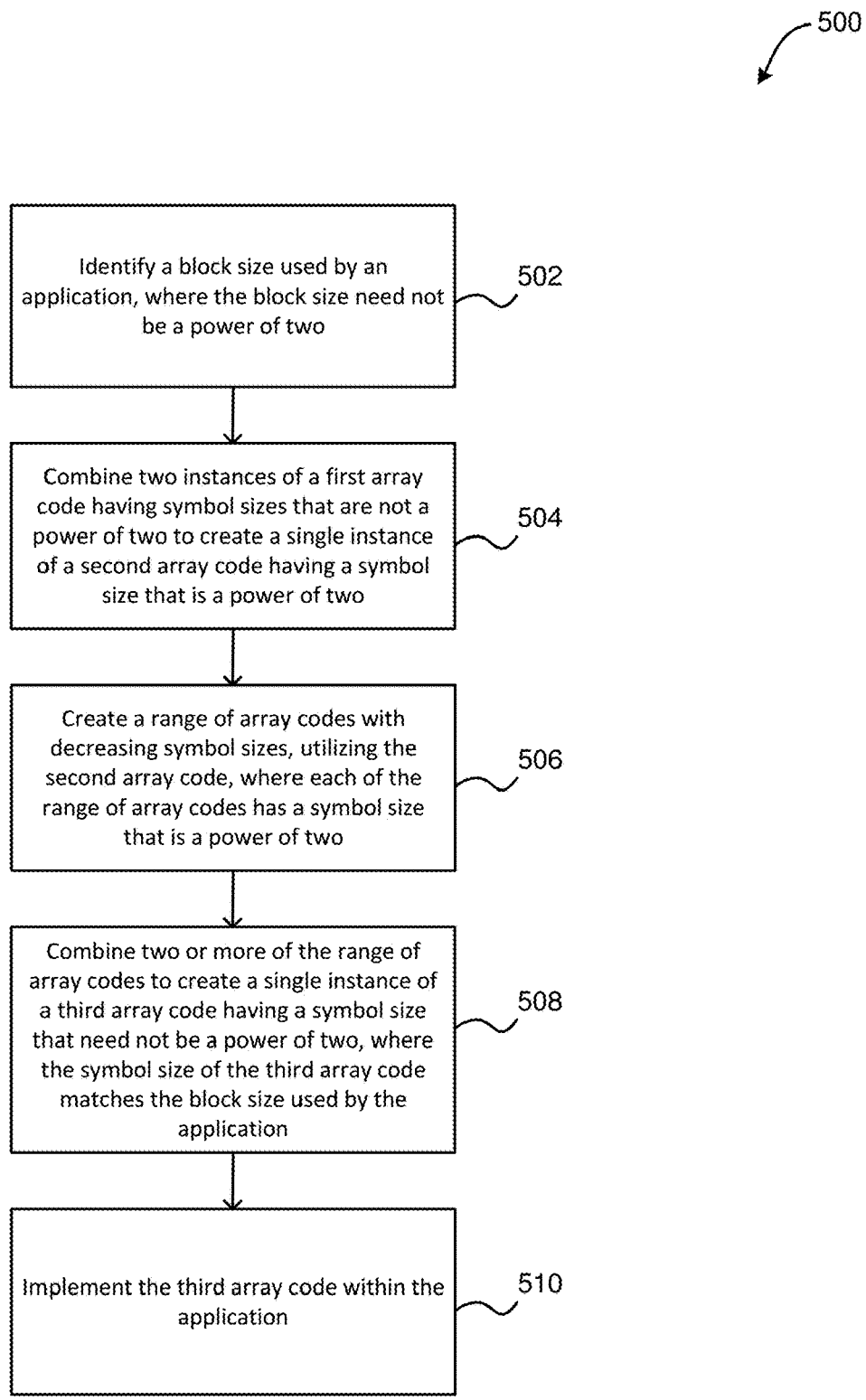
FIG. 5 illustrates a method for combining a range of array codes to create a single instance of an array code having a symbol size that matches an application block size that is not necessarily a power of two, in accordance with one embodiment.

Now referring to FIG. 5, a flowchart of a method 500 for combining a range of array codes to create a single instance of an array code having a symbol size that matches an application block size that is not necessarily a power of two is shown according to one embodiment. The method 500 may be performed in accordance with the present invention in any of the environments depicted in FIGS. 1-2, among others, in various embodiments. Of course, more or less operations than those specifically described in FIG. 5 may be included in method 500, as would be understood by one of skill in the art upon reading the present descriptions.

Each of the steps of the method 500 may be performed by any suitable component of the operating environment. For example, in various embodiments, the method 500 may be partially or entirely performed by one or more servers, computers, or some other device having one or more processors therein. The processor, e.g., processing circuit(s), chip(s), and/or module(s) implemented in hardware and/or software, and preferably having at least one hardware component may be utilized in any device to perform one or more steps of the method 500. Illustrative processors include, but are not limited to, a central processing unit (CPU), an application specific integrated circuit (ASIC), a field programmable gate array (FPGA), etc., combinations thereof, or any other suitable computing device known in the art.

As shown in FIG. 5, method 500 may initiate with operation 502, where a block size used by an application is identified, where the block size need not be a power of two. Additionally, method 500 may proceed with operation 504, where two instances of a first array code having symbol sizes that are not a power of two are combined to create a single instance of a second array code having a symbol size that is a power of two.

Further, method 500 may proceed with operation 506, where a range of array codes are created with decreasing symbol sizes, utilizing the second array code, where each of the range of array codes has a symbol size that is a power of two. Further still, method 500 may proceed with operation 508, where two or more of the range of array codes are combined to create a single instance of a third array code having a symbol size that need not be a power of two, where the symbol size of the third array code matches the block size used by the application.

Further still, method 500 may proceed with operation 510, where the third array code is implemented within the application.

In this way, different instances of power of two symbols may be assembled to create a third array code block of an arbitrary size that need not be a power of two.

Array Code Compositions for Power of Two and Variable Block Sizes

Overview

The generalized EVENODD array code places numerical constraints on symbol size such that a tension exists between achieving a block size small enough for the intended application, supporting the desired code rate and correction of the desired number of errors or erasures and making use of the widest available data types for increased throughput from a vectorized implementation.

In one embodiment, a construction composes two instances of Evenodd, an erasures-only diminution of the generalized EVENODD code, to create a new code, Block-Code, which extends the capabilities of the base code and has a convenient, power of two, fixed block size. Another simple construction composes multiple instances of Block-Code to create a second new code, PowerCode, for variable block sizes.

Introduction

Error correcting codes and erasure codes are used in data transmission and data storage applications to recover corrupt or lost data. For example, Reed-Solomon codes are a commercially important group of codes based on finite fields which are CPU intensive when implemented in software. Alternative codes based on polynomial rings place numerical constraints on the shapes of the codes (block size and number of data and parity blocks) such that they may not immediately fit the target application.

In one embodiment, two constructions, BlockCode and PowerCode, may be used in reshaping codes when adapting them for production use.

EVENODD Code

The EVENODD code is represented by a generalization $\mathcal{A}(p, r)$. The shape of an instance of the code is derived from a prime number p. The instance for prime p supports up to p data blocks and is an MDS code when the number of parities $r \leq 3$ but, when r>3, the MDS property depends on the specific choice of p.

Symbols consist of p−1 elements when stored or transmitted but are extended to p elements during encoding and reconstruction and subsequently normalized back to p−1 elements. The array code is formalized in terms of operations on the ring of polynomials modulo $M_p(\chi)=1+\chi+ \ldots +\chi^{p-1}$.

In one embodiment, multiplication and addition may be vectorized in the ring of polynomials modulo $M_p(\chi)$ which may improve the performance of array code implementations. Native wide vector types may be used for the p−1 elements of the symbols of the array code. For a vector type of size v, this implies a symbol size of v(p−1) and a block size some multiple of that.

To achieve a power of two block size it may be necessary for v to be a power of two and to select a prime p one greater than a power of two. The only such primes are the Fermat primes of which only five are known. Note that it is impossible, for example, to use the 512b vector type and immediately achieve an MDS code with 4 KiB block size and more than 17 data, blocks or more than 5 parity blocks.

Exemplary BlockCode Design

Figure 6:
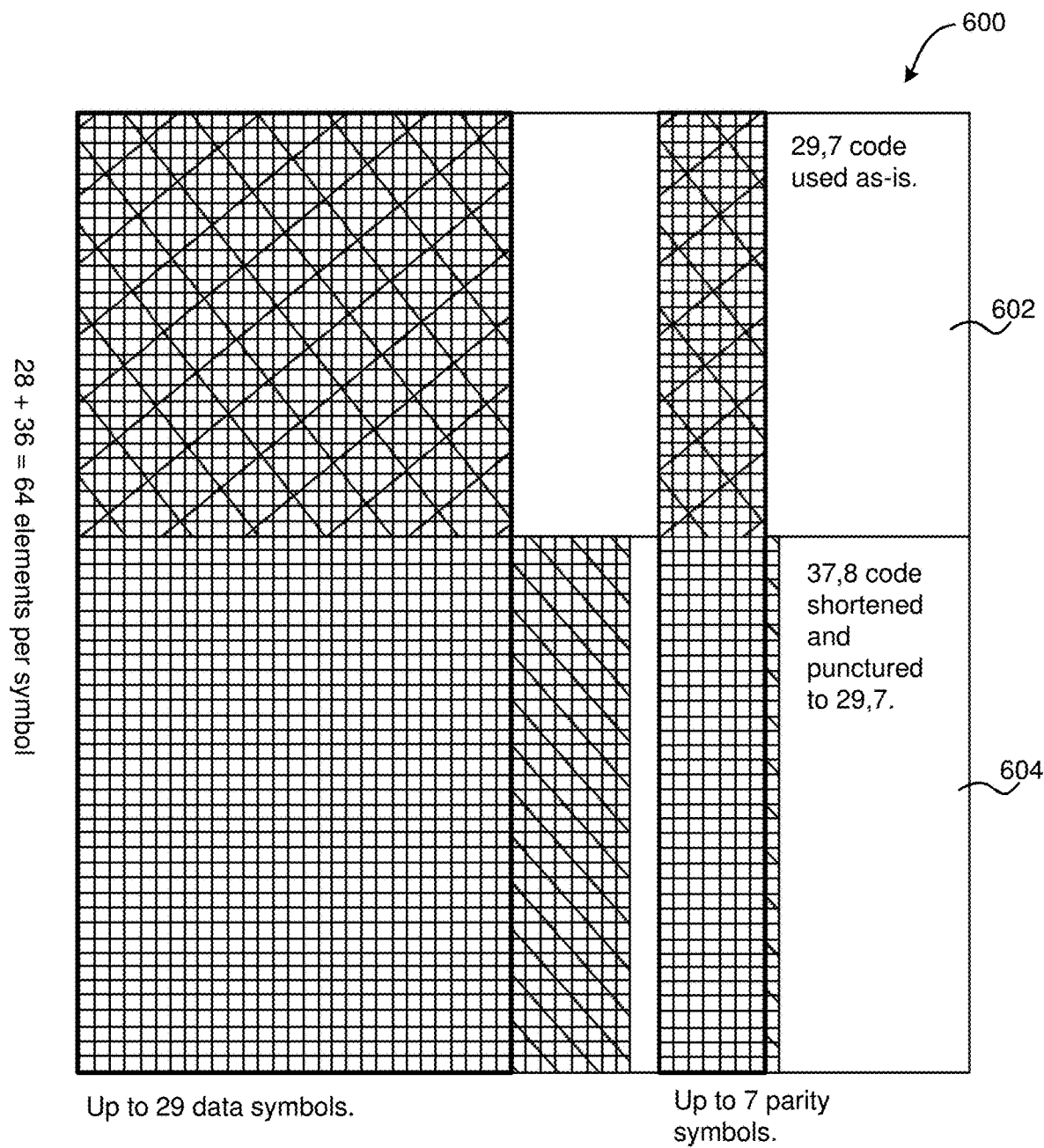
FIG. 6 illustrates the creation of a new array code, BlockCode, with 64 elements per symbol, in accordance with one embodiment.

The first part of the solution becomes apparent upon observing that (29−1)+(37−1)=64: FIG. 6 shows the creation of a new array code, BlockCode 600, with 64 elements per symbol by composing base code $\mathcal{A}$ (29, 7) 602 with base code $\mathcal{A}$ (37, 8) 604. The symbol size of 64 elements is obtained despite the necessity of shortening and puncturing the $\mathcal{A}$ (37, 8) 604 code to mate it with the $\mathcal{A}$ (29, 7) 602 code because neither shortening nor puncturing change the value of 36 elements per symbol of the $\mathcal{A}$ (37, 8) 604 code. Note that with BlockCode 600 it becomes possible to use the widest 512b vector type and achieve an MDS code with 4 KiB block size, up to 29 data blocks and up to 7 parity blocks and this represents an extension of the capability of the base code.

In one embodiment, base code $\mathcal{A}$ (29, 7) 602 and base code $\mathcal{A}$ (37, 8) 604 may be selected in response to determining that the sum of the vertical height of such base codes is a power of two. When instantiated with power of two sized elements, the resulting symbol size of the resulting BlockCode 600 will then be a power of two multiple of this vertical height, which will also be a power of two.

It is possible to compose any number of codes, but the code width is limited to the minimum from any of the constituent codes, while the symbol size accumulates, so compositions of fewer codes tend to be better at achieving greater width for a given symbol size. Table 1 lists some examples which extend the envelope of the base code. More specifically, Table 1 lists example combinations of codes resulting in power of two symbol sizes and some extension of the envelope of the base code.

TABLE 1

| $p_1$ | $p_2$ | p | $r_{maxMDS}$ | v = 128 b | v = 256 b | v = 512 b |
|---|---|---|---|---|---|---|
| 11 | 23 | 11 | 6 | 512 B | 1 KiB | 2 KiB |
| 29 | 37 | 29 | 7 | 1 KiB | 2 KiB | 4 KiB |
| 59 | 71 | 59 | 7 | 2 KiB | 4 KiB | 8 KiB |

Exemplary PowerCode Design

By instantiating BlockCode for each element type in a range of power of two sized elements, it is possible to create a set of BlockCodes with a range of power of two sized symbols. Just as any natural number can be represented in binary by summing powers of two, so can a code with any block size be assembled by composing codes with power of two sized symbols.

Coding performance was expected to initially increase with symbol size (since progressively larger symbols allow elements to be implemented using progressively wider native types or arrays of the largest native types) and then decrease again for symbols large enough to impact the cache hit ratio. Instead of selecting a maximum symbol size sufficient for composing a design's maximum required block size according to the binary technique, it was therefore expected to be beneficial to select the best performing symbol size as the maximum symbol size and repeat that symbol size as necessary when composing codes for larger block sizes.

At the other end of the range, the minimum symbol size is constrained by the number of elements per symbol and the minimum element size. With 64 elements per symbol, BlockCode instantiated with 1 B sized elements is sufficient to meet a 64 B granularity design goal. Alternatively, the use of element sizes down to individual bits would relax this constraint and allow for 8 B granularity.

In one embodiment, a new code, PowerCode, instantiates BlockCodes with decreasing power of two sized elements (and hence symbol sizes) and then composes them at run time to create a code with a block size that is any multiple of the smallest symbol size.

Figure 7:
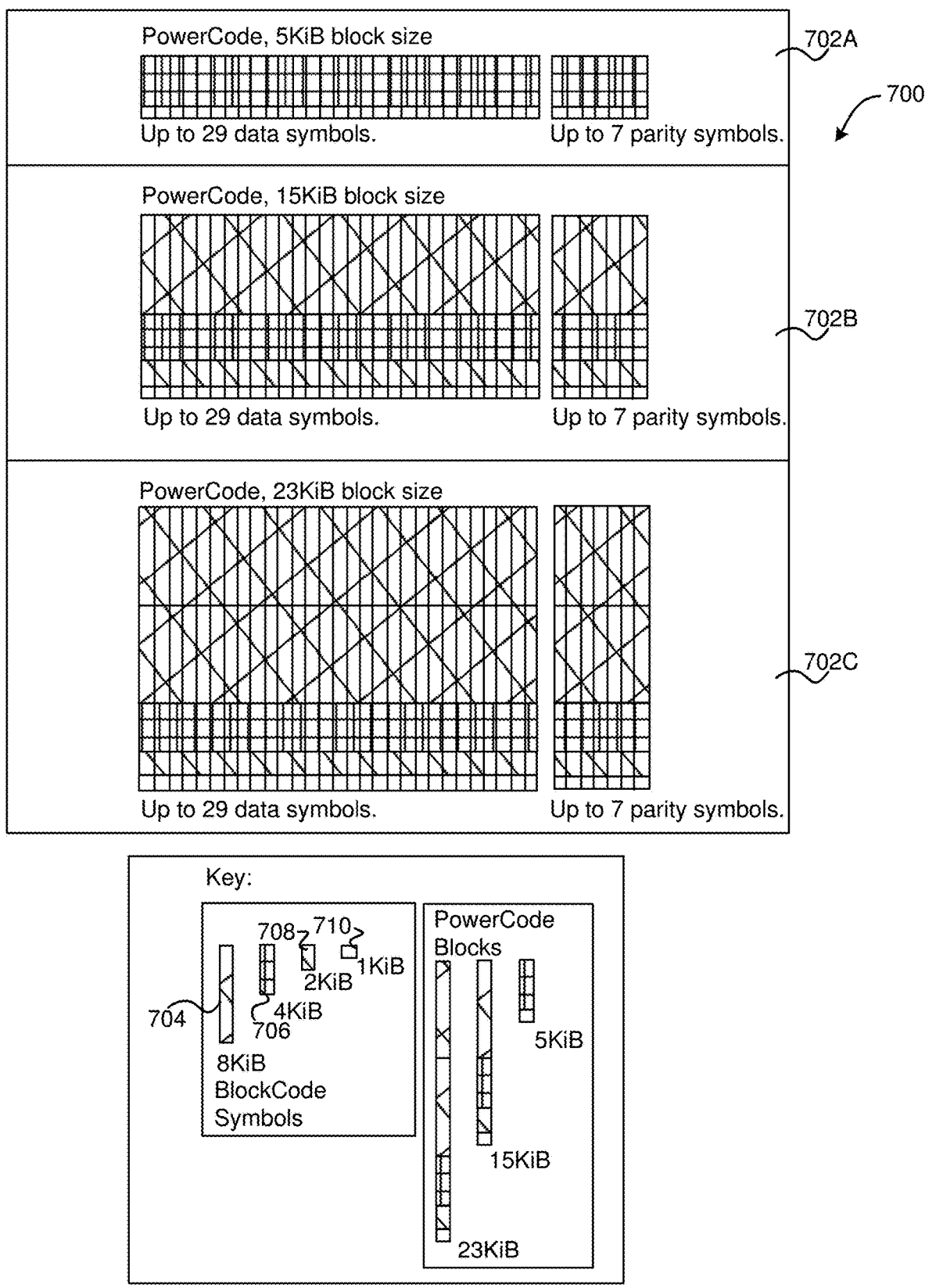
FIG. 7 illustrates an example of PowerCode operating with several example block sizes, in accordance with one embodiment.

FIG. 7 shows an example 700 of PowerCode operating with several example block sizes 702A-C: the largest 8 KiB symbol size 704 is repeated while it fits, after which, descending powers of two symbols 706-710 are used as necessary to achieve the desired block size.

In this way, once a range of power of two symbol sizes has been created (e.g., via BlockCode), PowerCode may assemble those symbols to create any desired block size subject to the granularity constraint of the minimum constituent power of two symbol size, with improved performance. High performance symbols (e.g., the 8 KiB symbol size 704) may have a better cache hit performance, and may therefore be repeated within a block as many times as they will fit. Resulting gaps may be filled in with smaller symbols 706-710, starting with the largest symbol 706, then the second largest symbol 708, and finally the smallest symbol 710, until the desired block size is achieved.

Implementation Notes

One exemplary target platform is an embedded system written in the C language so allocation from the heap and any dependency on linking with the C++ standard library have been avoided.

Although one exemplary target is multithreaded, the code classes are not themselves threadsafe except for any static data shared between instances. Each instance contains the (non-automatic) resources required for one execution thread; the intention is that a separate instance should be dedicated to each thread assigned to encoding or reconstruction work.

Encoding and reconstruction are performed by a common method, Run, which (re)constructs any data or parity block listed by the caller as an erasure. Erasures of data and parity blocks are listed separately as this simplifies the composition of codes of different widths.

In the C++ source, the letter E is used in relation to elements of the code symbols and the letter X is used in relation to erasures.

Exemplary Block Code Implementation

Table 2 shows a template BlockCode, parameterized by the element type E, the number of parities R and a list Ps of the primes of the base codes to compose, implemented by configuring a more general TupleCode with a base code Evenodd, an implementation of the generalized EVENODD code restricted to erasures-only.

TABLE 2

BlockCode [1] =
{template< class E, Int R, Int... Ps > using
BlockCode = TupleCode < Evenodd< E, Ps, R >... >;}

TupleCode allows for the composition of one or more codes (passed using variadic template parameters). The most general template, which accepts a minimum of one code as a parameter, is used for the final code in a TupleCode (including the case of TupleCodes consisting of only one code). In this case the TupleCode is the code itself (by public inheritance).

The template partially specialized to accept a minimum of two codes as parameters is used in all other cases and recursively implements the TupleCode using the first template parameter code as the Head at the supplied offset and then using a TupleCode of the remaining codes as the Tail at an incremental offset corresponding to the location directly after the location of the first code.

Exemplary Power Code Implementation

In one embodiment, PowerCode may be implemented as a template parameterized by the base code template Code, the power of two POW of the smallest element size in bytes and the number NUM of powers of two to use.

The template Code accepts an integer parameter specifying the power of two of the code element size in bytes.

Exemplary Element Implementation

Least, which allows types to be selected programmatically according to the MAX value to be stored in them, is used to implement a template Element with integer parameters specifying the power of two of the element size in bytes and the target instruction set architecture. Element is used to adapt BlockCode for use by PowerCode.

The most general Element template only works up to 8 B. A common base class _Element uses an array of vector types to achieve larger power of two sizes and is inherited by two more classes which specialize Element for SSE 4.2 and AVX 2. Contiguous Elements are used to map the data for encoding and reconstruction so the curiously recurring template pattern is used here, for (compile-time) polymorphism without the overhead of a virtual function table pointer, to preserve the required memory footprint.

Instantiating for each target ISA allows a single binary to support multiple generations of vector extensions and use the most performant available at run time.

Table 3 shows the sizes of types used for element implementation according to CPU feature availability and the resulting symbol size assuming 64 elements per symbol.

TABLE 3

| POW | Element | AVX 512 | AVX 2 | SSE 4.2 | Symbol Size |
| --- | --- | --- | --- | --- | --- |
| 9 | 512 B | 8 × 512 B | 16 × 512 B | 32 × 512 B | 32 KiB |
| 8 | 256 B | 4 × 512 B | 8 × 512 B | 16 × 512 B | 16 KiB |
| 7 | 128 B | 2 × 512 B | 4 × 512 B | 8 × 512 B | 8 KiB |
| 6 | 64 B | 1 × 512 B | 2 × 512 B | 4 × 512 B | 4 KiB |
| 5 | 32 B | 1 × 256 B | 1 × 512 B | 2 × 512 B | 2 KiB |
| 4 | 16 B | 1 × 128 B | 1 × 256 B | 1 × 512 B | 1 KiB |
| 3 | 8 B | 1 × 64 B | 1 × 128 B | 1 × 256 B | 512 B |
| 2 | 4 B | 1 × 32 B | 1 × 64 B | 1 × 128 B | 256 B |
| 1 | 2 B | 1 × 16 B | 1 × 32 B | 1 × 64 B | 128 B |
| 0 | 1 B | 1 × 8 B | 1 × 16 B | 1 × 32 B | 64 B |

As shown in Table 3, a variety of symbol sizes between 32 KiB and 64 B may be created utilizing block code (as shown in FIG. 6, for example) with different element sizes.

In one embodiment, AVX 512 support may be implemented, and performance may be evaluated using AVX 512 instructions. In another embodiment, the unwinding of the Frame Mac operation may be automated. In yet another embodiment, further performance optimization may be performed including analysis and optimization of the assembly generated by the compiler, and analysis and optimization of the use of the memory subsystem and CPU micro-architecture. In another embodiment, the use of powers of byte lengths may be refactored and bit manipulation may be used to extend the codes down to sub-byte element sizes and 8 B granularity. In another embodiment, BlockCode may be used in log structured array applications, where wide codes with more parities may provide advantage, or in RAID applications where the 4 KiB symbol size is a natural fit.

In this way, TupleCode demonstrates a generic mechanism for adapting a base code or codes to support additional shapes. BlockCode composes two instances of the Evenodd code to obtain a code with up to 29 data blocks and 7 parity blocks and block sizes down to 4 KiB when vectorized with 512b types. BlockCode is one example of many possible TupleCode configurations which could be used to extend the capability of a base code. PowerCode composes multiple instances of BlockCode to achieve a code with variable block size and 64 B granularity. PowerCode worked best on the test platform when configured with a maximum symbol size of 8 KiB or 16 KiB. TupleCode (including BlockCode) may provide a performance advantage from smaller, more cache friendly symbols by extending the envelopes of the base codes into regions where smaller symbol sizes are sufficient to achieve the desired block size, code width and number of parities.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a FPGA, etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A computer-implemented method, comprising:
   identifying a block size used by an application, where the block size is a power of two;
   in response to determining that the block size used by the application cannot be provided by a first array code, constructing, utilizing a plurality of instances of the first array code, a single instance of a second array code having a symbol size that matches the block size used by the application, where the symbol size of the first array code is not a power of two, and the symbol size of the second array code is always a power of two; and
   recovering from an error during an implementation of the application, utilizing the second array code.

2. The computer-implemented method of claim 1, wherein the first array code and the second array code each include an erasure code or an error correcting code (ECC).

3. The computer-implemented method of claim 1, wherein the second array code is different from the first array code.

4. The computer-implemented method of claim 1, further comprising determining additional requirements for the application, the additional requirements including a code width that indicates a sum of a number of data symbols and a number of parity symbols to by implemented within an array code to be used by the application.

5. The computer-implemented method of claim 1, wherein the symbol size of the first array code is always a function of a prime number.

6. The computer-implemented method of claim 1, wherein a vertical dimension of the second array code is always a power of two.

7. The computer-implemented method of claim 1, wherein the block size includes a size of data packets transferred and stored by the application.

8. The computer-implemented method of claim 1, wherein the symbol size includes a minimum predetermined size of a portion of data for which the second array code is utilized.

9. The computer-implemented method of claim 1, wherein the second array code is constructed by joining together a stacked configuration of the plurality of instances of the first array code in order to create the second array code with a symbol size that is a power of two.

10. The computer-implemented method of claim 1, wherein the error includes data erasure during the implementation of the application.

11. The computer-implemented method of claim 1, further comprising constructing a third array code utilizing a plurality of instances of the second array code, where the second array code is different from the third array code, and where the second array code has a symbol size that is a power of two and the third array code has a predetermined block size subject to a granularity constraint.

12. The computer-implemented method of claim 11, wherein the third array code is constructed by combining the plurality of instances of the second array code.

13. The computer-implemented method of claim 11, wherein the application is run within one or more systems utilizing the third array code.

14. A computer program product for composing array codes for power of two and variable block sizes, the computer program product comprising a computer readable storage medium having program instructions embodied therewith, wherein the computer readable storage medium is not a transitory signal per se, the program instructions executable by a processor to cause the processor to perform a method comprising:
   identifying, utilizing the processor, a block size used by an application, where the block size is a power of two;
   in response to determining that the block size used by the application cannot be provided by a first array code, constructing, utilizing the processor and a plurality of instances of the first array code, a single instance of a second array code having a symbol size that matches the block size used by the application, where the symbol size of the first array code is not a power of two, and the symbol size of the second array code is always a power of two; and
   recovering, utilizing the processor, from an error during an implementation of the application, utilizing the second array code.

15. The computer program product of claim 14, wherein the first array code and the second array code each include an erasure code or an error correcting code (ECC).

16. The computer program product of claim 14, wherein the second array code is different from the first array code.

17. The computer program product of claim 14, further comprising determining, utilizing the processor, additional requirements for the application, the additional requirements including a code width that indicates a sum of a number of data symbols and a number of parity symbols to by implemented within an array code to be used by the application.

18. The computer program product of claim 14, wherein the symbol size of the first array code is always a function of a prime number.

19. The computer program product of claim 14, wherein a vertical dimension of the second array code is always a power of two.

20. A system, comprising:
- a processor; and
- logic integrated with the processor, executable by the processor, or integrated with and executable by the processor, the logic being configured to:
- identify a block size used by an application, where the block size is a power of two;
- in response to a determination that the block size used by the application cannot be provided by a first array code, construct, utilizing a plurality of instances of the first array code, a single instance of a second array code having a symbol size that matches the block size used by the application, where the symbol size of the first array code is not a power of two, and the symbol size of the second array code is always a power of two; and
- recover from an error during an implementation of the application, utilizing the second array code.

* * * * *